United States Patent
Lin et al.

(10) Patent No.: US 8,693,265 B2
(45) Date of Patent: Apr. 8, 2014

(54) DATA INVERSION FOR DUAL-PORT MEMORY

(75) Inventors: Tzu-Kuei Lin, Chu-Pai (TW); Jonathan Tsung-Yung Chang, Hsinchu (TW); Hung-Jen Liao, Hsin-Chu (TW); Yen-Huei Chen, Jhudong Township, Hsinchu County (TW); Jhon Jhy Liaw, Zhudong Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 77 days.

(21) Appl. No.: 13/552,692

(22) Filed: Jul. 19, 2012

(65) Prior Publication Data

US 2014/0022852 A1    Jan. 23, 2014

(51) Int. Cl.
*G11C 16/04* (2006.01)
(52) U.S. Cl.
USPC ....... 365/189.05; 365/205; 365/207; 365/191
(58) Field of Classification Search
CPC ............ G11C 7/065; G11C 7/12; G11C 7/22; G11C 11/4091; G11C 16/26; G11C 7/1051; G11C 7/1078; G11C 7/1006; G11C 11/4097; G11C 7/06
USPC ...................... 365/189, 205, 207, 191, 189.14
See application file for complete search history.

(56) References Cited

U.S. PATENT DOCUMENTS 8,553,481 B2 *  10/2013  Chow ............................ 365/205

* cited by examiner

*Primary Examiner* — David Lam
(74) *Attorney, Agent, or Firm* — Duane Morris LLP

(57) ABSTRACT

A semiconductor memory includes first and second memory storage latches each including first and second ports. A first pair of bit lines is coupled to the first ports, and a second pair of bit lines is coupled to the second ports. The first and second pairs of bit lines are twisted between the first and second memory storage latches. A first sense amplifier is coupled to the first pair of bit lines for outputting data, and a second sense amplifier is coupled to the second pair of bit lines for outputting an intermediate data signal. Output logic circuitry is coupled to an output of the second sense amplifier and is configured to output data based on the intermediate data signal and a control signal that identifies if the data is being read from the first memory storage latch or from the second memory storage latch.

20 Claims, 16 Drawing Sheets

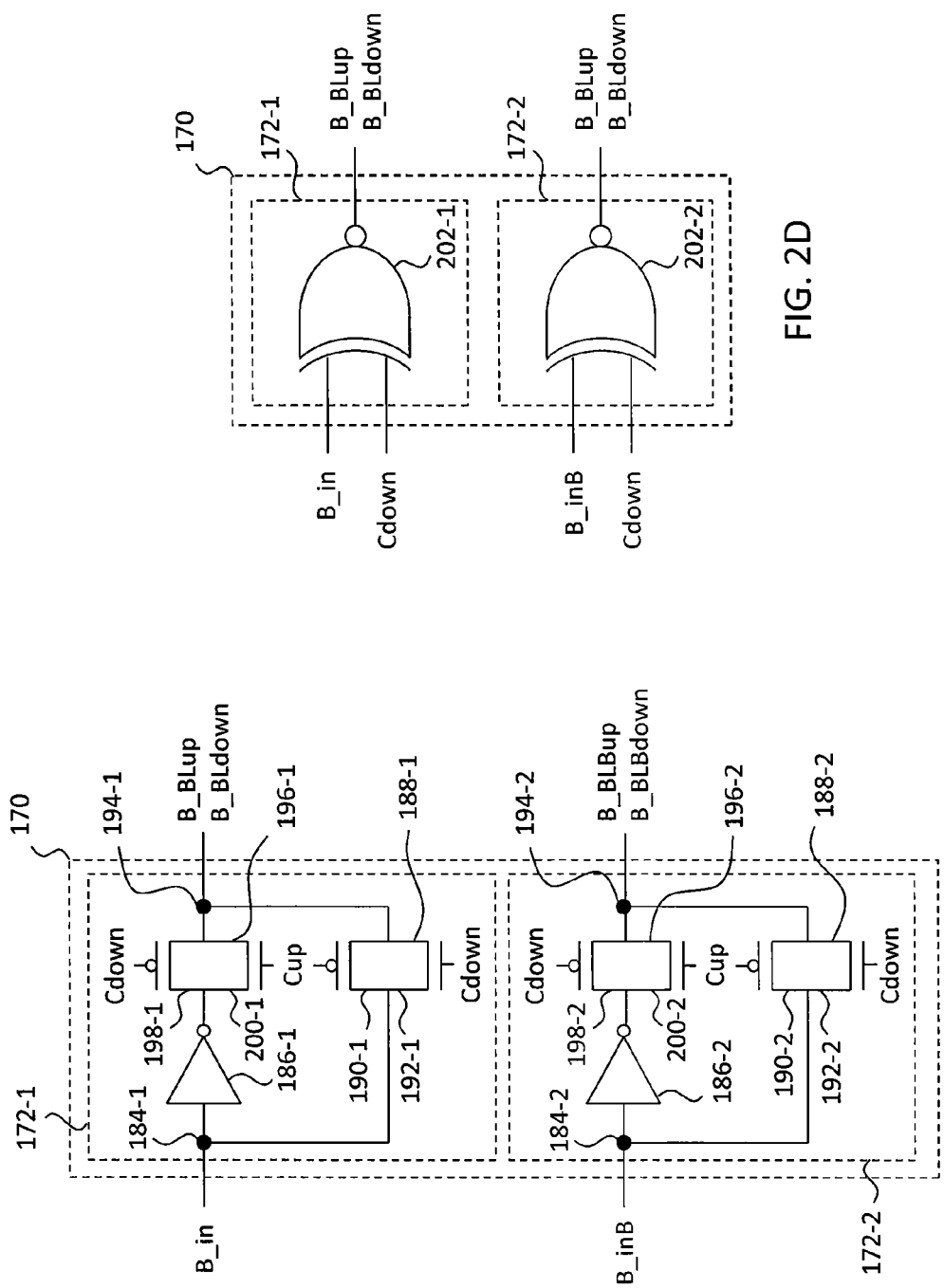

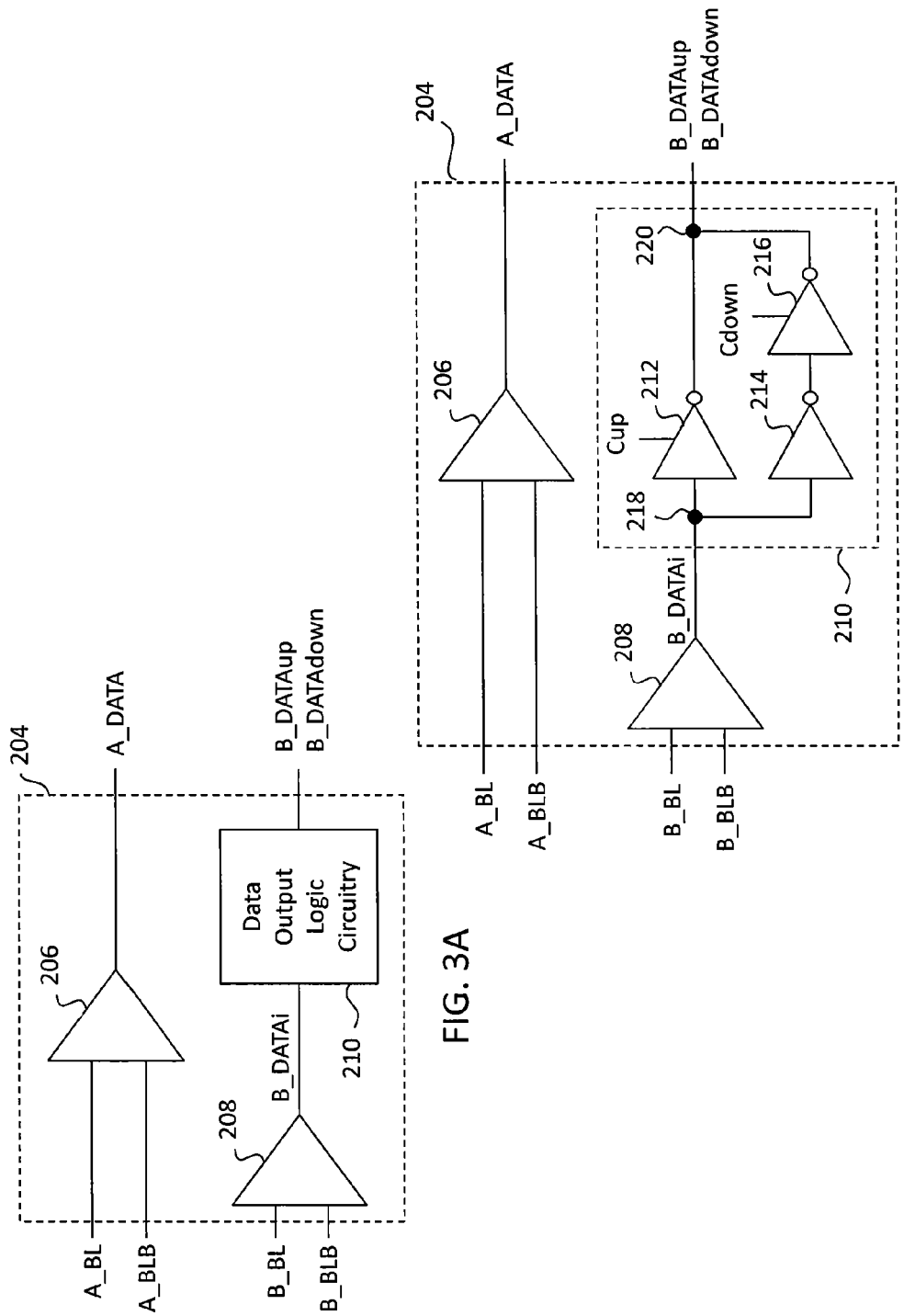

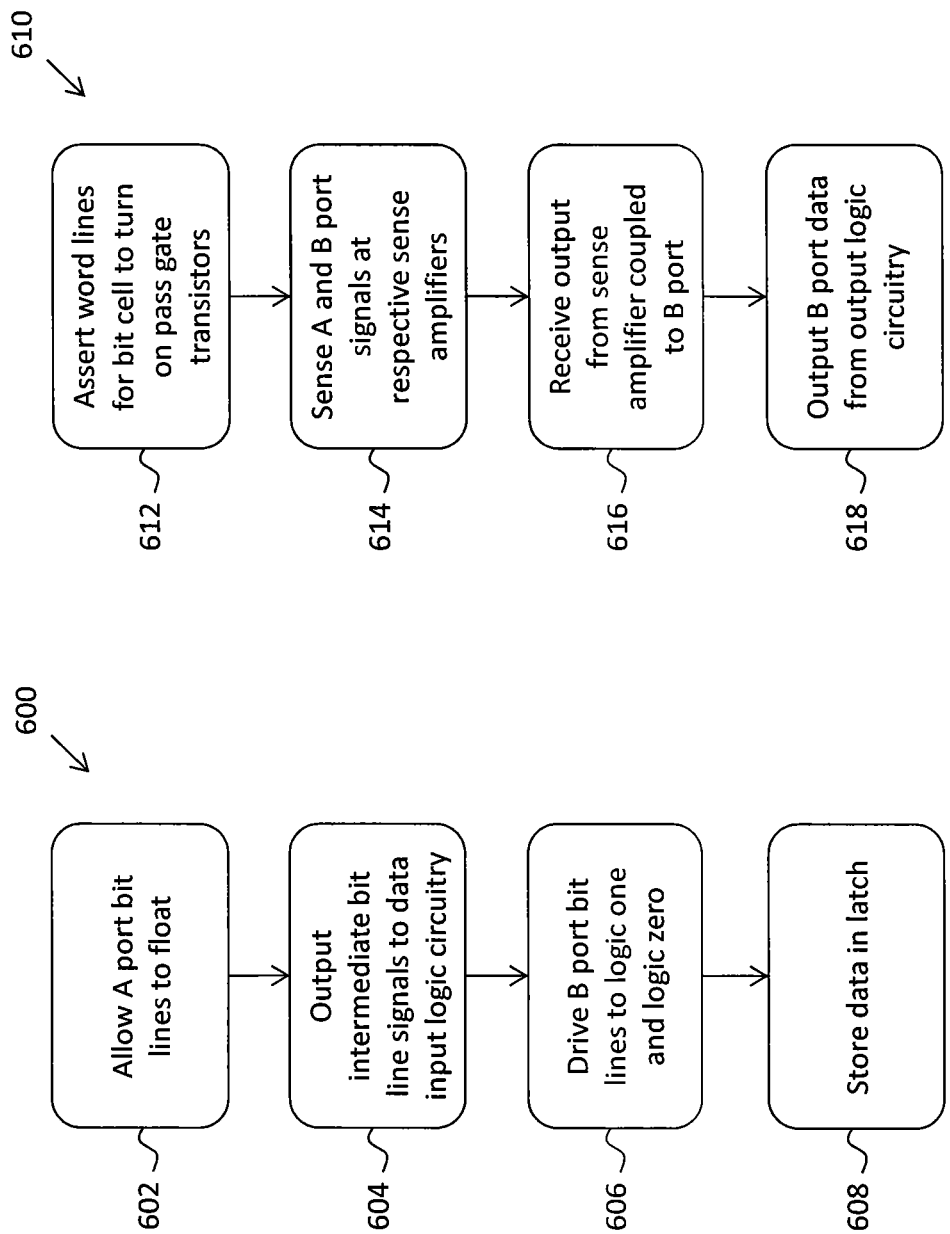

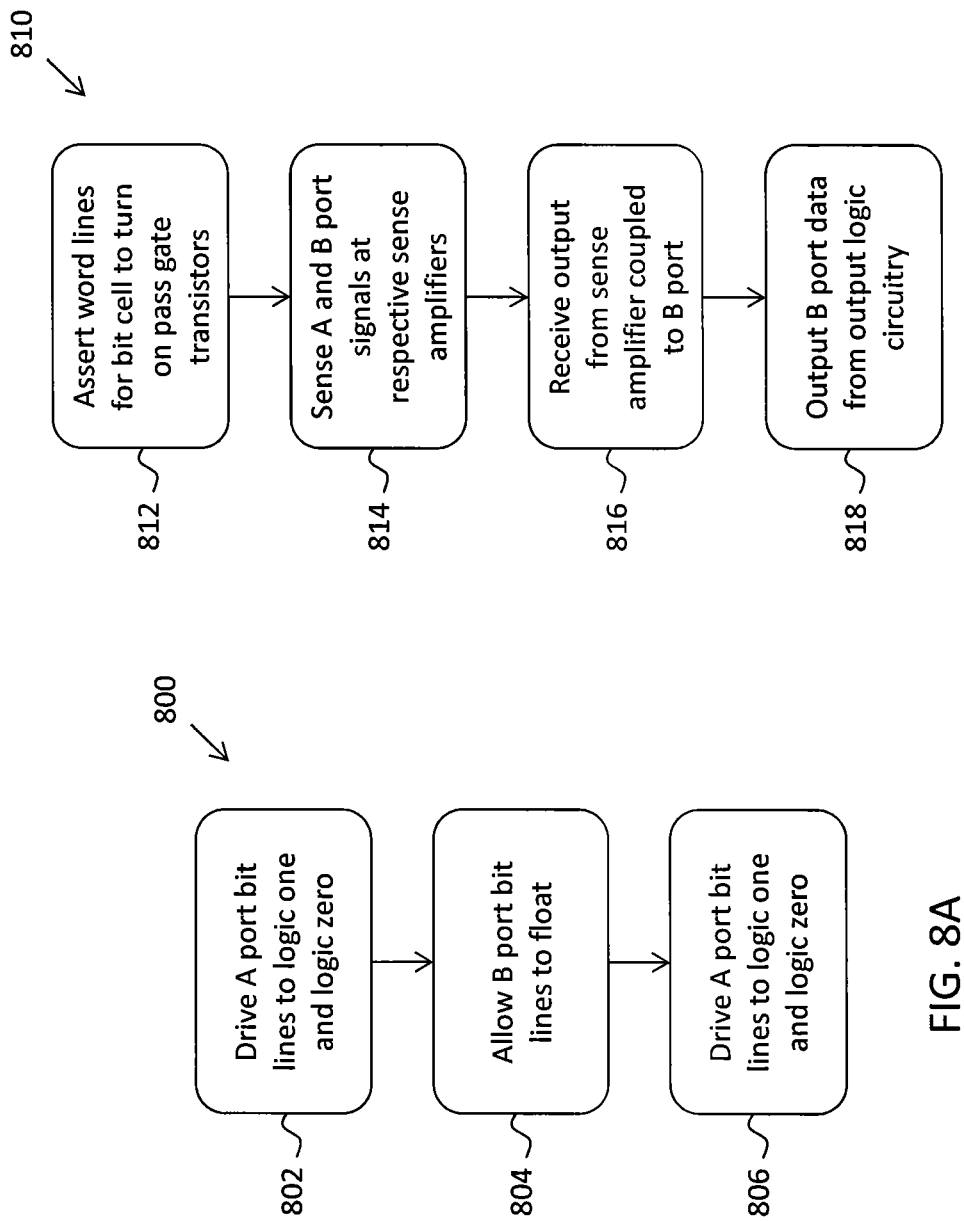

DATA INVERSION FOR DUAL-PORT MEMORY

FIELD OF DISCLOSURE

The disclosed systems and methods relate to semiconductor memories. More particularly, the disclosed systems and methods relate to dual-port semiconductor memories having twisted bit lines.

BACKGROUND

Static random access memories ("SRAM") include a plurality of cells disposed in rows and columns to form an array. SRAM cells include a plurality of transistors coupled to bit lines and word lines that are used to read and write a bit of data to the memory cell. Dual port SRAMs are a specific type of SRAM that enables multiple reads or writes to occur at approximately the same time. Conventional dual port SRAM structures include word lines in different metal layers, which causes different capacitive loading due to the different metal layers being used to route signals of the SRAM. Such different capacitive loading results in a disparity between operating times of the word lines, which affects the speed of the overall SRAM.

Some dual port SRAMs include "twisted" bit lines to provide symmetrical balance to a sense amplifier, which is used to sense data. However, SRAMs with twisted bit lines still suffer from data inversion issues.

BRIEF DESCRIPTION OF THE DRAWINGS

FIG. 2A is a block diagram of one example of the functional components of SA/write driver blocks that drive the bit lines in accordance with the dual port memory illustrated in FIG. 1A.

FIGS. 2B-2D illustrate various embodiments of data input logic circuitry in accordance with the function components of the SA/write driver blocks illustrated in FIG. 2A.

FIG. 3A is a block diagram of one example sensing circuitry in accordance with the dual port memory illustrated in FIG. 1A.

FIGS. 3B-3D illustrate various embodiments of data output logic circuitry in accordance with the sensing circuitry illustrated in FIG. 3A.

FIGS. 6A and 6B are flow diagrams of methods of writing and reading data from a second port of a lower memory bit cell in accordance with some embodiments, respectively.

FIGS. 8A and 8B are flow diagrams of methods of writing and reading data from a first port of an upper memory bit cell in accordance with some embodiments, respectively.

DETAILED DESCRIPTION

This description of the exemplary embodiments is intended to be read in connection with the accompanying drawings, which are to be considered part of the entire written description.

The disclosed semiconductor memory arrays and their associated methods of operation advantageously prevent data inversion for twisted memory bit cells. In some embodiments, the semiconductor memory arrays include data input or driving logic circuitry for driving bit lines coupled to one of two ports of a bit cell to ensure data is properly written to a bit cell or latch. The sense amplifiers also include logic circuitry for ensuring data is properly read out from a latch or bit cell.

Figure 1A:
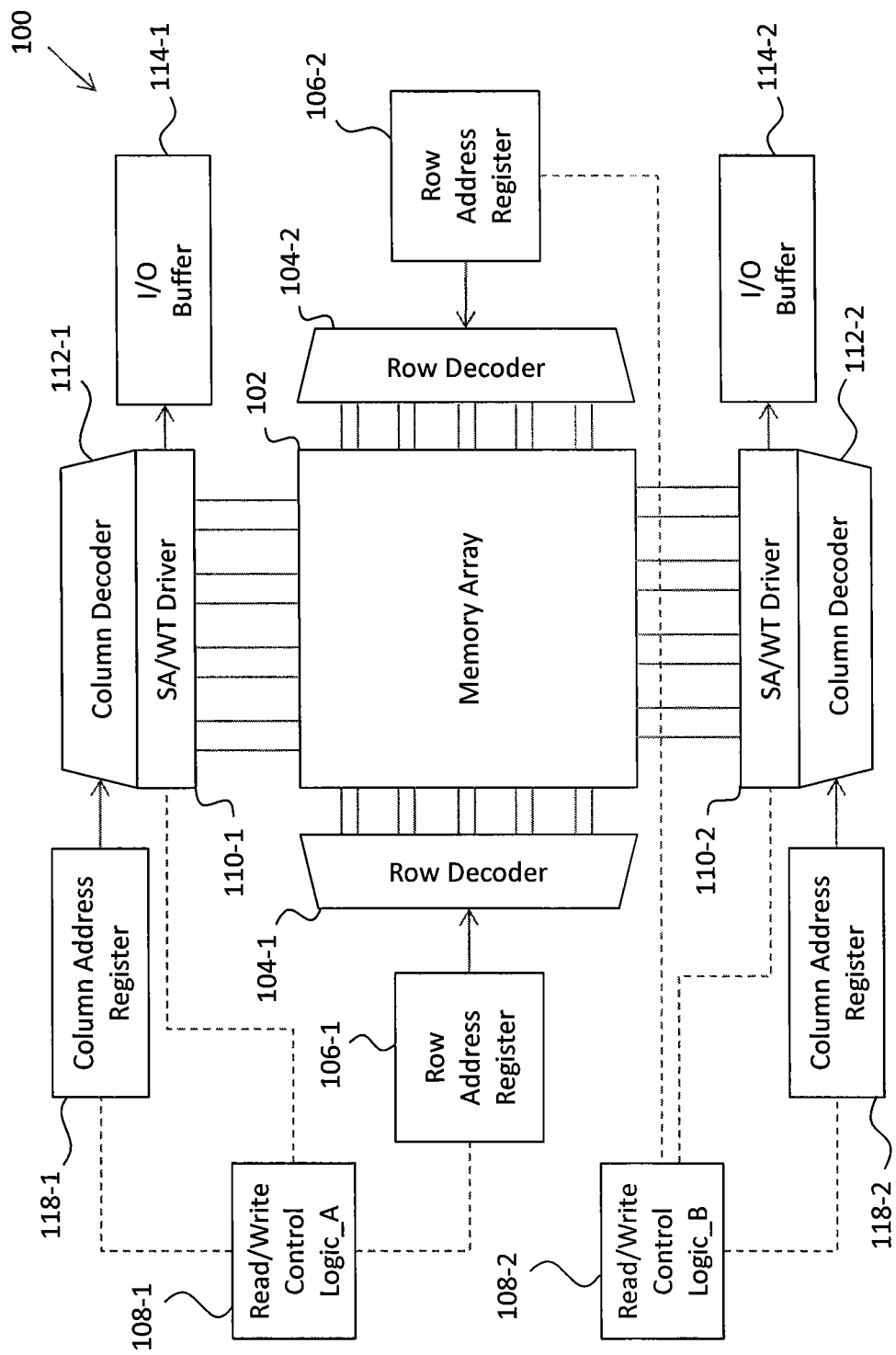
FIG. 1A is a block diagram of one example of a dual port memory in accordance with some embodiments.
Figure 1B:
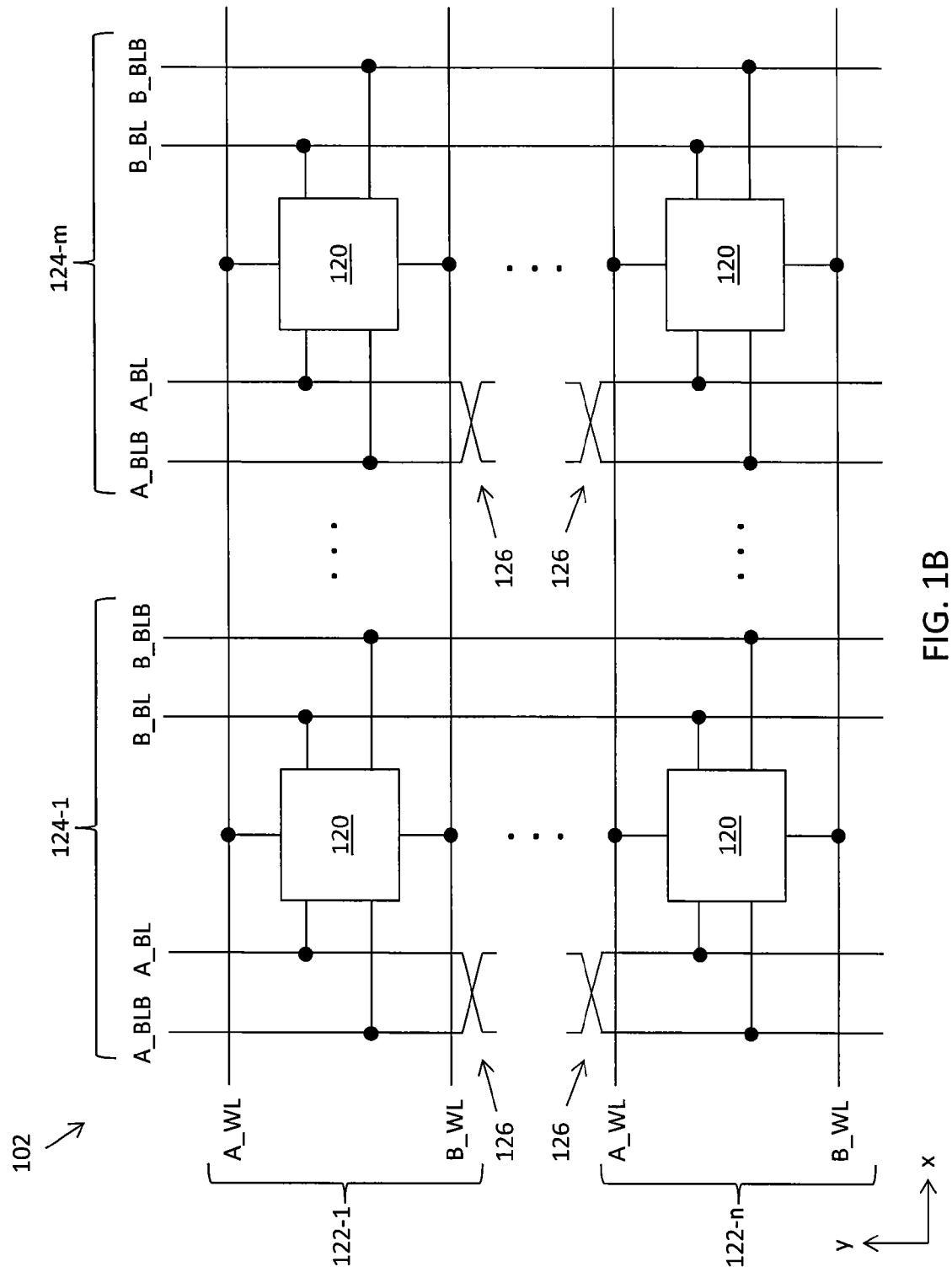
FIG. 1B is a block diagram of one example of a memory array in accordance with the dual port memory illustrated in FIG. 1A.

FIG. 1A illustrates one example of a dual port memory 100, which includes an array 102 of memory bit cells 120 (see FIG. 1B). Array 102 is coupled to row decoders 104-1, 104-2 (collectively "row decoders 104"), which receive row addresses from row address registers 106-1, 106-2 (collectively "row address registers 106"), respectively. Row address registers 106 are coupled to respective read/write control logic 108-1, 108-2 (collectively "read/write control logic 108").

Memory array 102 is also coupled to a sense amplifiers ("SA")/write driver blocks 110-1, 110-2 (collectively "SA/write driver blocks 110"), which are coupled to respective column decoders 112-1, 112-2 (collectively column decoders 112") and input/output buffers 114-1, 114-2 (I/O buffers 114"). Column decoders 112 are each coupled to a respective column address register 118-1, 118-2 (collectively "column address registers 118") that receive addresses from read/write control logic 108.

Turning now to FIG. 1B, which illustrates one example of a dual port memory array 102, bit cells 120 are arranged in a number, n, of rows 122 and a number, m, of columns 124. Each bit cell 120 is disposed between a pair of word lines, A_WL and B_WL, that extend horizontally across the memory array (i.e., in an x-direction) and a two pairs of complementary bit lines ("BL"), A_BL, B_BL, A_BLB, and B_BLB, that extend vertically across the memory array (i.e., in a y-direction). Bit lines A_BLB and A_BL include twists 126, which are used to mitigate coupling issues between bit lines A_BL and B_BL.

Figure 1C:
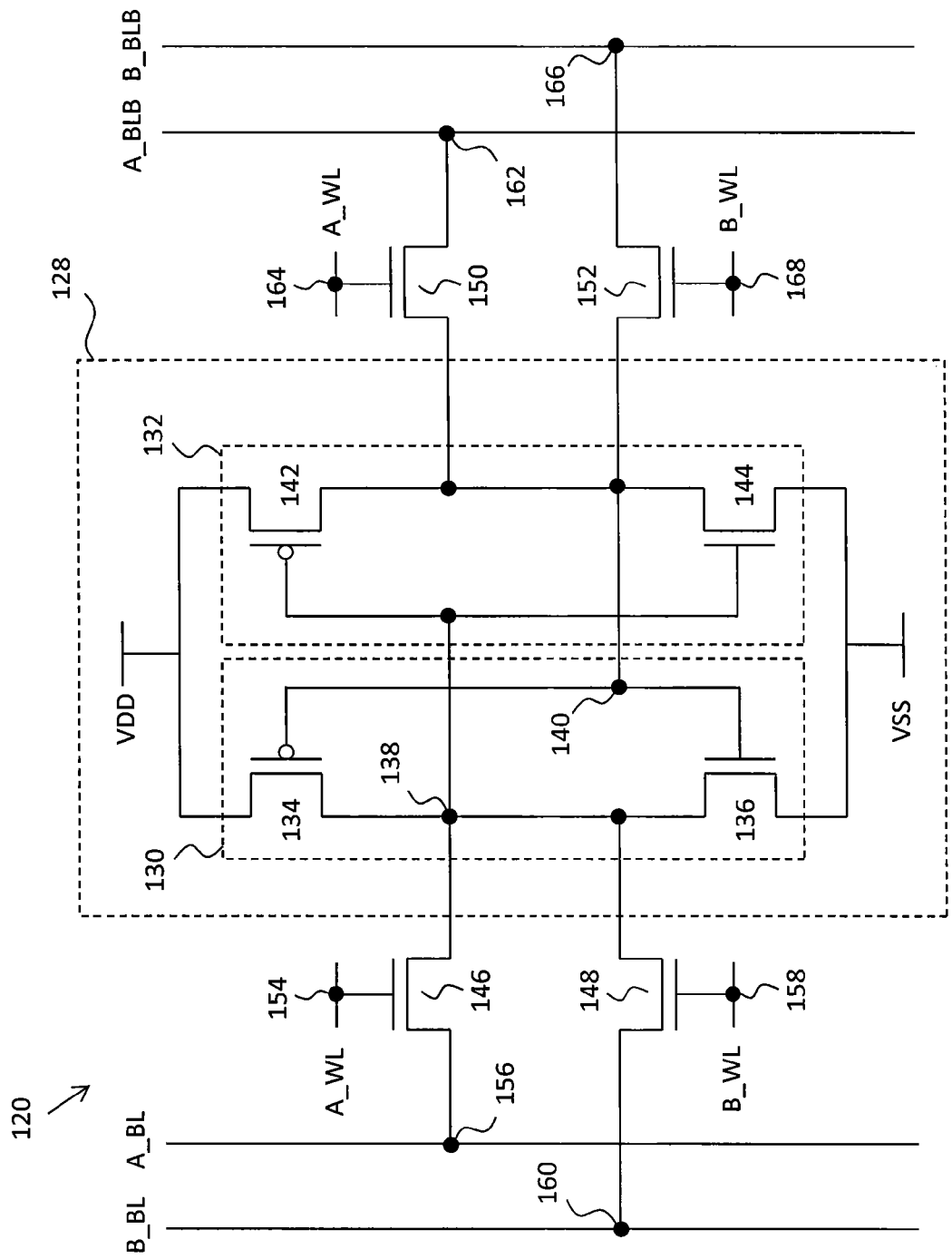
FIG. 1C illustrates one example of a dual port bit cell in accordance with the memory array illustrated in FIG. 1B.

One example of an eight transistor ("8T") bit cell 120 is illustrated in FIG. 1C. Although an 8T bit cell is described, one of ordinary skill in the art will understand that bit cells can be formed using other numbers of transistors including, but not limited to, 6T, 10T, 12T, and 14T, to name a few possibilities. As shown in FIG. 1C, bit cell 120 includes a latch 128 formed by a pair of cross-coupled inverters 130, 132.

Inverter 130 includes a PMOS transistor 134, which functions a pull-up transistor, and an NMOS transistor 136, which functions as a pull-down transistor. PMOS transistor has its source coupled to high-voltage source, VDD, and its drain coupled to node 138 that serves as the output of inverter 130. NMOS transistor 136 of inverter 130 has its source coupled to low-voltage source VSS and its drain coupled to node 138. The gates of transistors 134 and 136 are coupled together at node 140, which serves as the input of inverter 130 and the output of inverter 132.

Inverter 132 includes a PMOS transistor 142, which serves as a pull-up transistor, and an NMOS transistor 144, which serves as a pull-down transistor. Transistor 142 has its source coupled to VCC, its gate coupled to node 138, and its drain coupled to node 140. Transistor 144 of inverter 132 has its source coupled to VSS, its drain coupled to node 140, and its gate coupled to node 138.

Bit cell 120 also includes a plurality of pass transistors 146, 148, 150, and 152. In some embodiments, transistors 146, 148, 150, and 152 are NMOS transistors, although one skilled in the art will understand that transistors 146, 148, 150, and 152 may be implemented as PMOS transistors. Transistor 146 has its gate coupled to word line A_WL at node 154, its source coupled to node 138, and its drain coupled to bit line A_BL at node 156. Transistor 148 has its gate coupled to word line B_WL at node 158, its source coupled to node 138, and its drain coupled to bit line B_BL at node 160. Transistor 150 has its source coupled to node 140, its drain coupled to bit line A_BLB at node 162, and its gate coupled to word line A_WL at node 164. Transistor 152 has its source coupled node 140, its drain coupled to bit line B_BLB at node 166, and its gate coupled to word line B_WL at node 168.

Figures 2A, 2B:
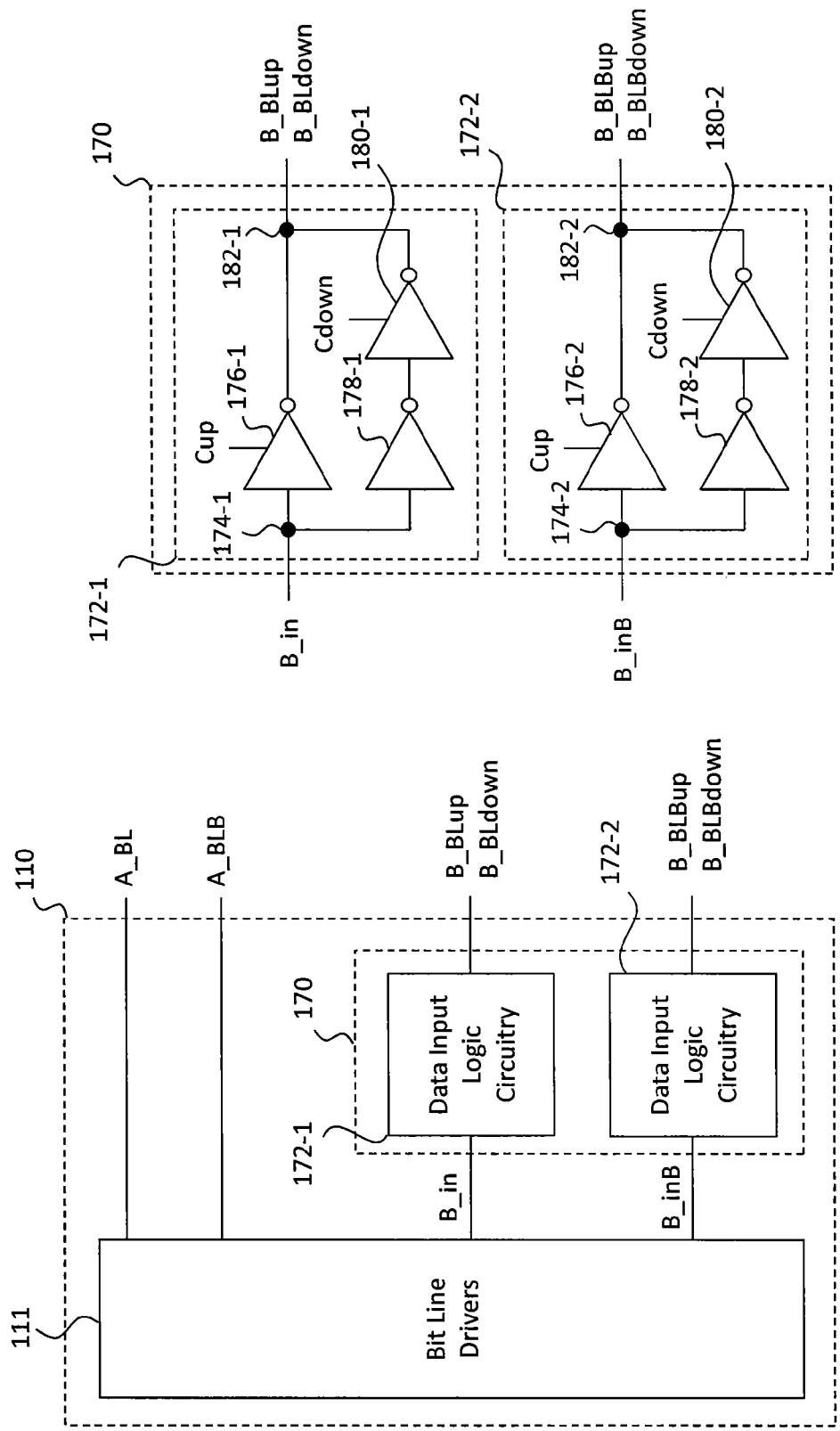

FIG. 2A is a block diagram of the functional components of SA/write driver blocks 110 that drive bit lines. As shown in FIG. 2A, bit line drivers 111 are configured to output signals to bit lines A_BL and A_BLB for controlling a first port (e.g., the "A" port) of adjacent memory bit cells 120. Data input logic circuitry blocks 172-1 and 172-2 ("data input logic circuitry blocks 172") are disposed between bit line drivers 111 and bit lines B_BL and B_BLB. Data input logic circuitry block 172-1 is configured to receive an input bit, B_in from bit line driver 111 and generate bit line signals for the "B" port a pair of adjacent memory bit cells that are coupled together via twisted bit lines as described in greater detail below. Data input logic circuitry block 172-2 is configured to receive an input bit, B_inB and generate bit line signals for the pair of adjacent bit cells that are coupled together via a bit line twist, i.e., B_BLBup and B_BLBdown.

Data input logic circuitry blocks 172 may be implemented in a variety of ways. In some embodiments, such as the embodiment illustrated in FIG. 2B, data input logic circuitry blocks 172 are implemented as a tri-state buffer. For example, data logic circuitry blocks 172 receive a respective input signal, i.e., B_in and B_inB, at node 174, which is coupled to the inputs of inverter 176 and 178. Inverter 176 has its output coupled to node 182, which serves as the output of data logic circuitry blocks 172. Inverter 176 is selectively turned on and off by control signal, Cup. Transistor 178 has its output coupled to the input of inverter 180, which has its output coupled to node 182. Transistor 180 is selectively turned on and off by control signal Cdown. In some embodiments, control signals Cup and Cdown are the most significant bit (and its inverse) from a word line decoder.

FIG. 2C illustrates one example of an embodiment in which data input logic circuitry 172 are implemented as multiplexers ("muxes"). As shown in FIG. 2C, muxes 172 include an input node 184 at which an input signal, e.g., B_in or B_inB, is received. Node 184 is coupled to the input of inverter 186 and to transmission gate 188, which is formed from a pair of transistors 190, 192. In some embodiments, transistor 190 is implemented as a p-type metal-oxide semiconductor ("PMOS") transistor having its gate coupled to receive control signal Cup, and transistor 192 is an n-type metal-oxide semiconductor ("NMOS") transistor having its gate coupled to receive control signal Cdown. The output of transmission gate 188 is coupled to node 194, which serves as the output of mux 172.

The output of inverter 186 is coupled to a transmission gate 196, which comprises a pair of transistors 198, 200. In some embodiments, transistor 198 is a PMOS transistor having a gate configured to receive control signal Cdown, and transistor 200 is an NMOS transistor having its gate configured to receive control signal Cup. The output of transmission gate 196 is coupled to output node 194.

In some embodiments, such as the embodiment illustrated in FIG. 2D, data input logic circuitry 172 are implemented as exclusive OR ("XOR") gates 202. As shown in FIG. 2D, XOR gates 202 include a first input configured to receive input signal B_in (or B_inB) and a second input configured to receive control signal Cdown. The output of XOR gates 202 are configured to output bit line signals, i.e., B_BLup, B_BLdown, B_BLBup, or B_BLBdown.

Figure 3C:
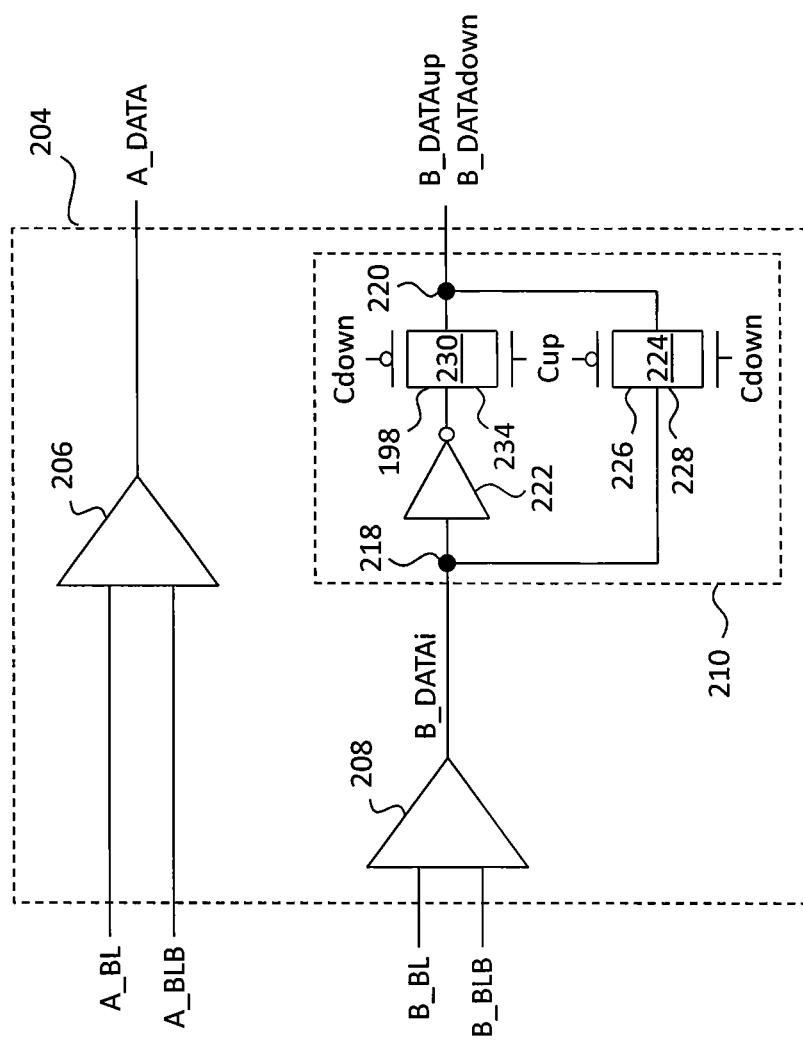

Examples of the sense amplifier and read buffers for the bit lines that correspond to the write drivers illustrated in FIGS. 2A-2D are shown in FIGS. 3A-3D. Referring first to FIG. 3A, a pair of sense amplifier and sensing circuitry 204 of SA/WT Driver block 110. Bit lines A_BL and A_BLB are received at sense amplifier 206, which outputs A_DATA based on the differential voltage of bit lines A_BL and A_BLB.

Bit lines B_BL and B_BLB are received at the inputs of sense amplifier 208, which outputs a B_DATA signal to data output logic circuitry 210. Data output logic circuitry 210 receives the B_DATA signal from the output of sense amplifier 208 and outputs a B_DATAup signal or B_DATAdown signal based on control signals as described in greater detail below.

In some embodiments, such as the embodiment illustrated in FIG. 3B, data output logic circuitry is implemented as tri-state buffer comprising inverters 212, 214, and 216. Inverter 212 has an input coupled to node 218, which serves as the input node of the tri-state buffer and is also coupled to the input of inverter 214. The output of inverter 212 is coupled to node 220, which serves as the output node of the tri-state buffer. Inverter 212 is selectively turned on and off in response to control signal Cup. The output of inverter 214 is coupled to the input of inverter 217, which has its output coupled to output node 220. Inverter 216 is selectively turned on and off in response to control signal Cdown.

FIG. 3C illustrates an embodiment of sense amplifier and sensing circuitry 204 in which data output logic circuitry 210 is implemented as a multiplexer. Multiplexer includes an input node 218 that is coupled to the output of sense amplifier 208 and to the inputs of inverter 222 and transmission gate 224. Transmission gate 224 includes a PMOS transistor 226 having a gate configured to receive control signal Cup and an NMOS transistor 228 having a gate configured to receive control signal Cdown. The output of transmission gate 224 is coupled to output node 220.

The output of inverter 222 is coupled to the input of transmission gate 230, which includes a PMOS transistor 232 and an NMOS transistor 234. Transistor 232 has a gate configured to receive control signal Cdown, and transistor 234 has a gate configured to receive control signal Cup. The output of transmission gate 230 is coupled to output node 220.

Figure 3D:
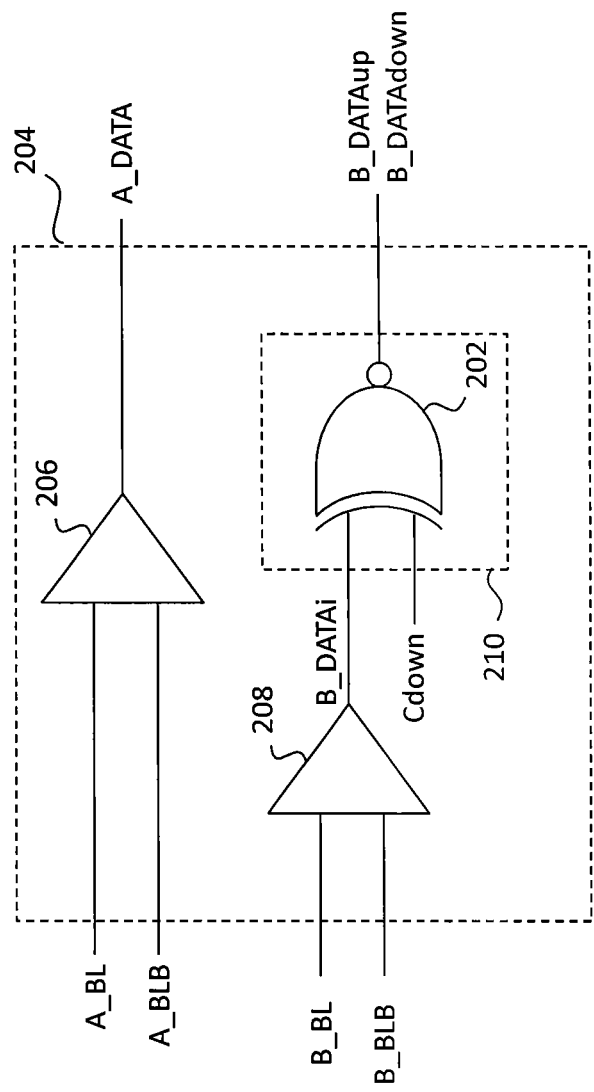

In some embodiments, such as the embodiment illustrated in FIG. 3D, data output logic circuitry 210 is implemented as an XOR gate 202. XOR gate 202 includes one input coupled to the output of sense amplifier 208 and a second input configured to receive control signal Cdown. The output of XOR gate 202 is configured to output B_DATAup or B_DATAdown signals.

Figures 4A, 4B:
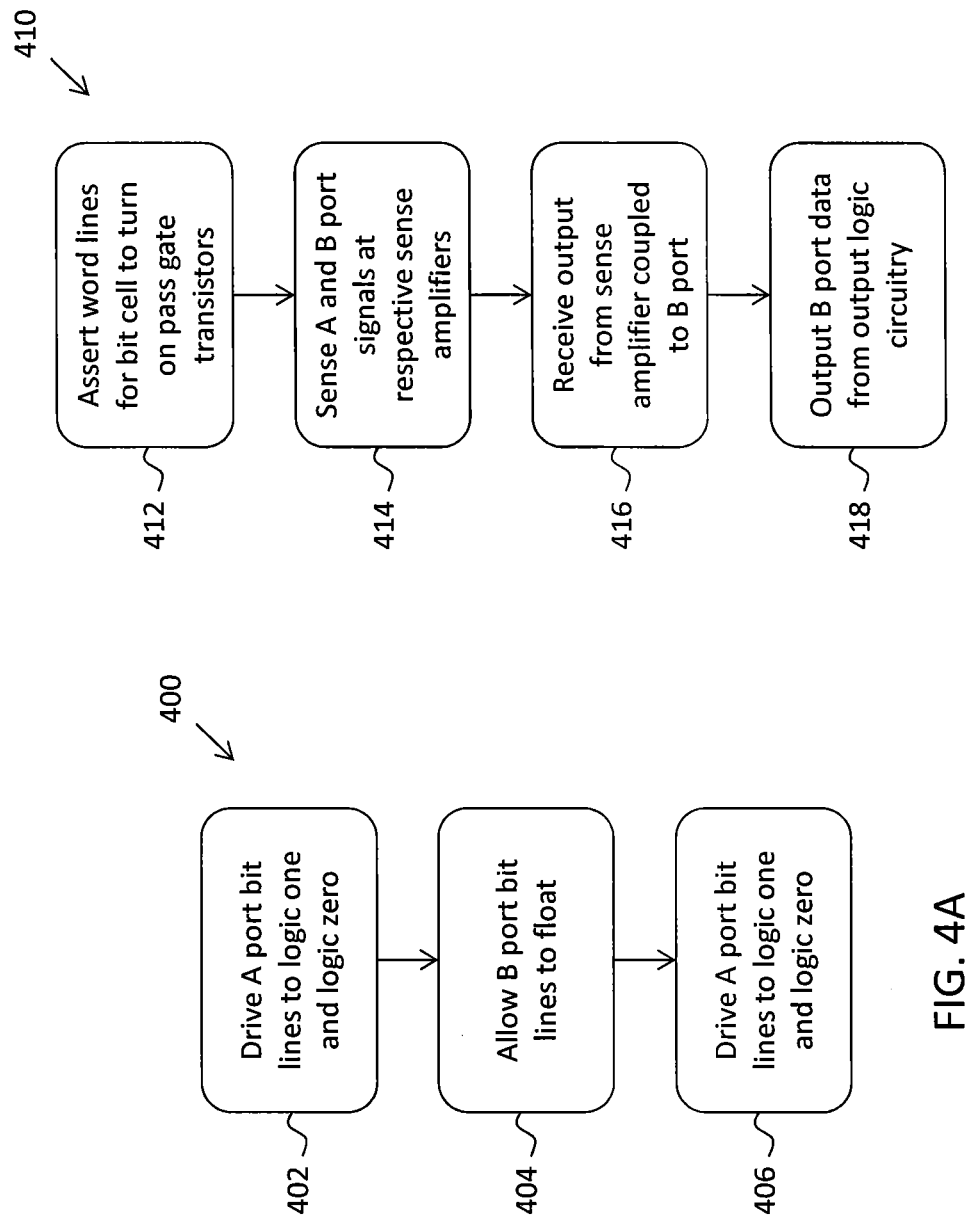
FIGS. 4A and 4B are flow diagrams of methods of writing and reading data from a first port of a lower memory bit cell in accordance with some embodiments, respectively.
Figures 5A, 5B:
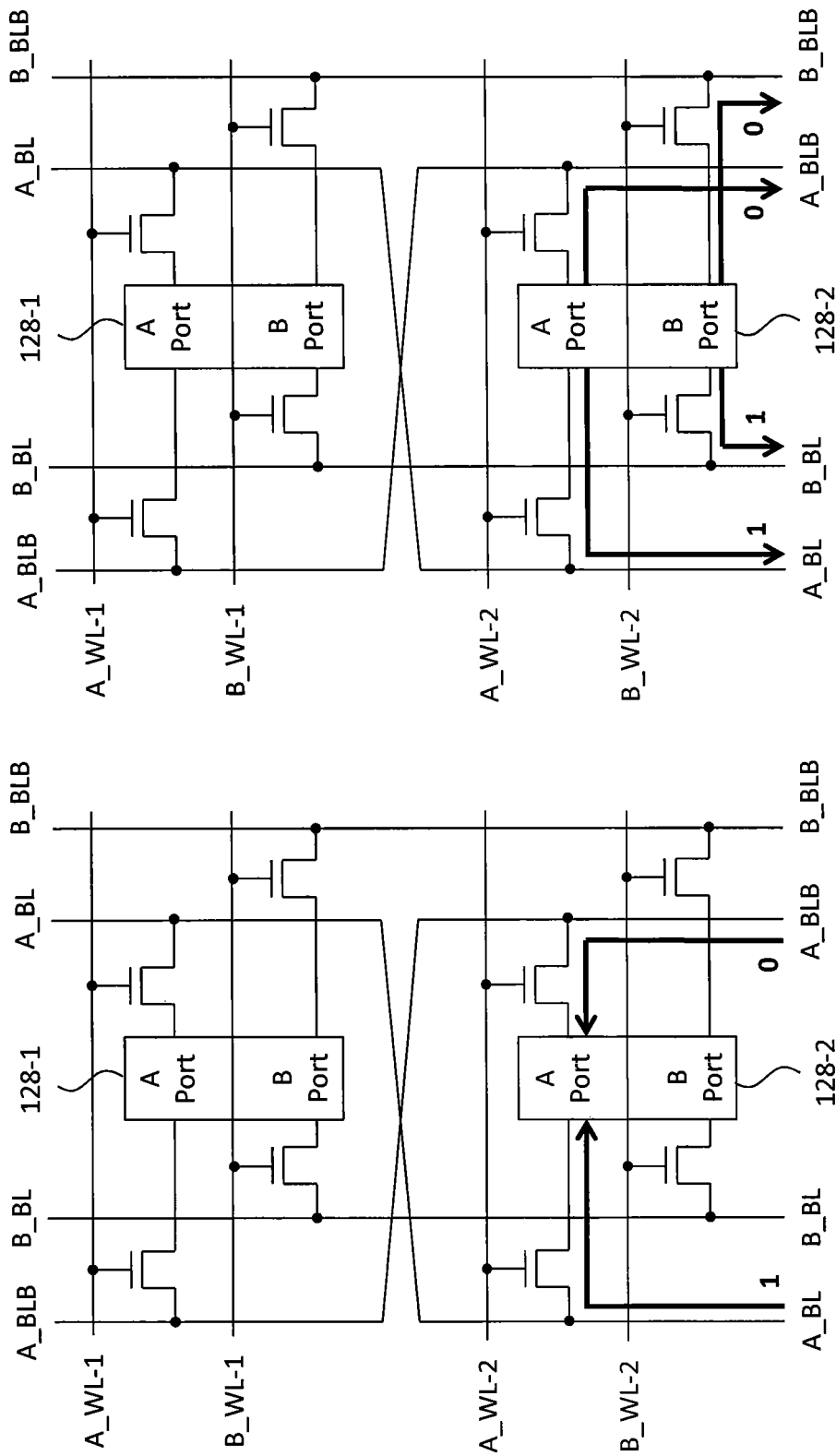
FIGS. 5A and 5B illustrate the data being written to and read from a lower bit cell of a pair of adjacent bit cells that are coupled together via twisted bit lines in accordance with the flow diagrams illustrated in FIGS. 4A and 4B, respectively.

The method of writing a logic one to a lower latch, e.g., latch 128-2 in FIG. 5A, via the "A" port is described with reference to FIGS. 4A and 5A in which FIG. 4A is a flow diagram of the method 400. At block 402, bit line drivers 111 output a logic one to bit line A_BL and a logic zero to bit line A_BLB.

At block 404, bit lines B_BL and B_BLB are allowed to float. The floating of bit lines B_BL and B_BLB occurs in response to signals B_in and B_inB, which are output by bit line drivers 111, floating.

At block 406, the logic one is stored at latch 128-2. To write the logic one to latch 128-2 via bit line A_BL, word lines A_WL-1, B_WL-1, and B-WL-2 are asserted low (e.g., logic zeroes) and word line A_WL-2 is asserted high (e.g., a logic one) such that pass gate transistors of latch 128-2 are turned on.

The reading of a logic one from the A port of latch 128-2 is described with reference to FIGS. 4B and 5B in which FIG. 4B is a flow diagram of one example of the method 410. At block 412, word lines A_WL-1 and B_WL-1 are asserted low such that pass gate transistors of latch 128-1 are turned off to decouple bit lines A_BL, B_BL, A_BLB, and B_BLB from latch 128-1, and word lines A_WL-2 and B_WL-2 are asserted high such that latch 128-2 is coupled to bit lines A_BL, B_BL, A_BLB, and B_BLB.

At block 414, the signals that develop on bit lines A_BL, B_BL, A_BLB, and B_BLB are sensed by sense amplifiers 206 and 208 as illustrated in FIGS. 3A-3D. Sense amplifier 206, which is coupled to bit lines A_BL and A_BLB, outputs A_DATA signal (i.e., a logic one) based on the sensed differential voltage between A_BL and A_BLB.

At block 416, data output logic circuitry 210 receives the output signal from sense amplifier 208, which receives signals from bit lines B_BL and B_BLB as inputs. In embodiments in which data output logic circuitry 210 is implemented as a tri-state buffer (FIG. 3B) or multiplexer (FIG. 3C), an intermediate data signal, B_DATAi, is output from sense amplifier 208 and is received at node 218. In embodiments in which data output logic circuitry 210 is implemented as an XOR gate 202 (FIG. 3D), the intermediate B_DATAi signal output from sense amplifier 208 is received at one of the inputs of XOR gate 202.

At block 418, data output logic circuitry 210 outputs data in response to the intermediate data signal received from sense amplifier 208, i.e., B_DATAi, and control signals Cup and/or Cdown. In embodiments in which output data logic circuitry 210 is implemented as a tri-state buffer, i.e., as illustrated in FIG. 3B, control signal Cup turns off inverter 212 and control signal Cdown turns on inverter 216 since data is being read from the lower latch 128-2. With inverter 212 off and inverters 214 and 216 on, the intermediate data signal, B_DATAi, is inverted twice and output from node 220.

In embodiments in which output data logic circuitry 210 is implemented as a multiplexer, i.e., as illustrated in FIG. 3C, control signals Cup and Cdown turn off transmission gate 230 and turn on transmission gate 224. With transmission gate 230 off, inverter 222 is decoupled from output node 220. Transmission gate 224 being turned on couples input node 218 to output node 220 such that intermediate data signal B_DATAi is output from node 220.

Referring now to FIG. 3D, the intermediate data signal B_DATAi output from sense amplifier 208 is received at an input of XOR gate 202. Control signal Cdown, which is a logic one when reading data from the lower latch 128-2, is received at a second input of XOR gate 202. With control signal Cdown and intermediate data signal B_DATAi being logic ones, XOR gate 202 outputs a logic one.

Figures 7A, 7B:
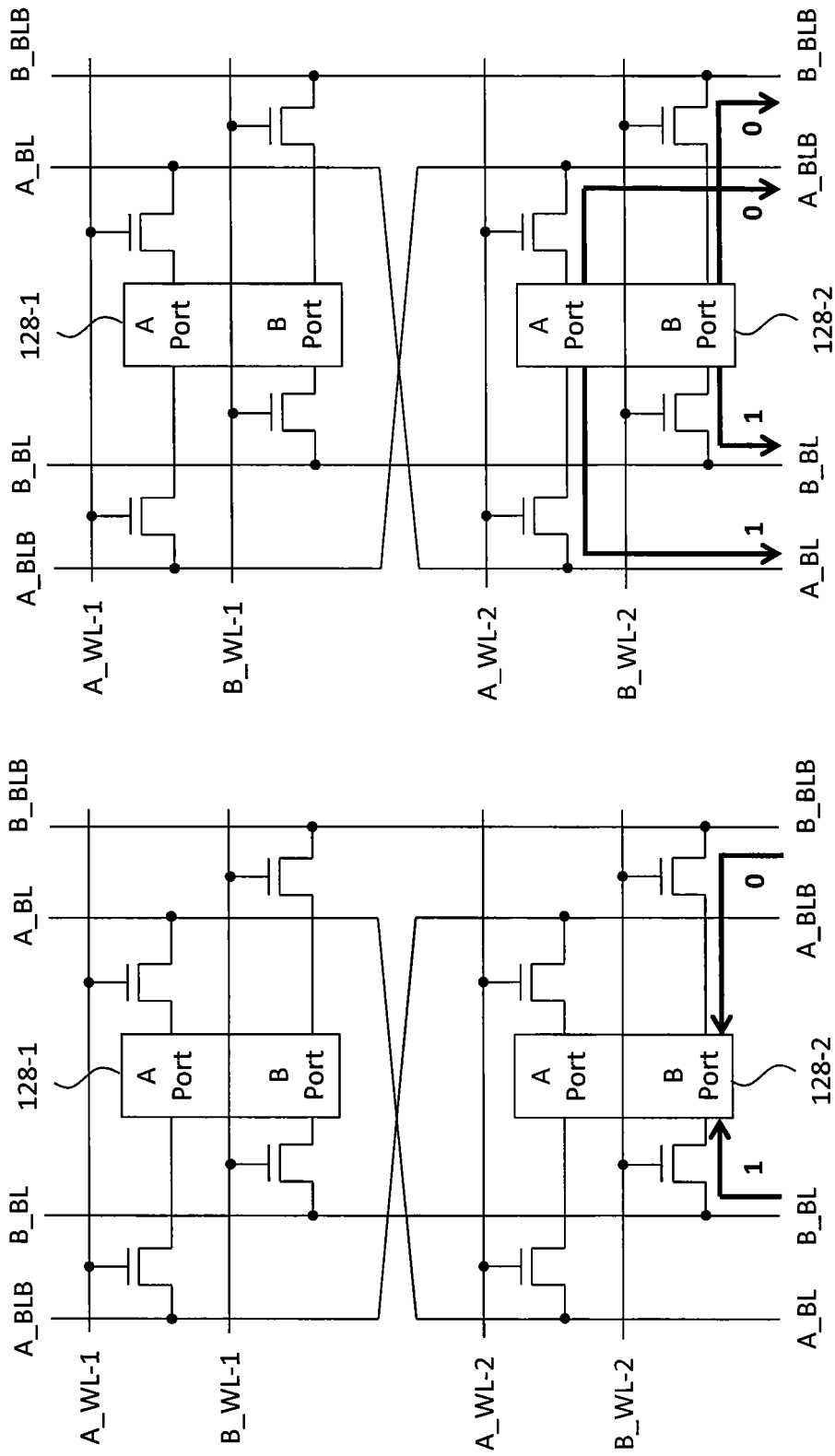
FIGS. 7A and 7B illustrate the data being written to and read from the lower bit cell of a pair of adjacent bit cells that are coupled together via twisted bit lines in accordance with the flow diagrams illustrated in FIGS. 6A and 6B, respectively.

The method of writing a logic one to a lower latch, e.g., latch 128-2 in FIG. 4B, via the B port is described with reference to FIGS. 6A and 7A in which FIG. 6A is a flow diagram of the method 600. At block 602, A port bit lines, i.e., A_BL and A_BLB, are allowed to float by bit line drivers 111.

At block 604, bit line drivers 111 for the B port output a logic one as signal B_in and a logic zero as signal B_inB to data input logic circuitry 172. In embodiments in which data input logic circuitry 172 is implemented as a tri-state buffer, i.e., as illustrated in FIG. 2B, signal B_in is received at node 174-1 data input logic circuitry 172-1 and signal B_inB is received at node 172-2 of data input logic circuitry 172-2. When data input logic circuitry 172 is implemented as a multiplexer as illustrated in FIG. 2C, signal B_in is received at node 184-1 and signal B_inB is received at node 184-2. In embodiments in which data input logic circuitry 172 is implemented as an XOR gate 202, the signal B_in signal is received at an input of XOR gate 202-1 and signal B_inB signal is received at an input of XOR gate 202-2.

At block 606, data input logic circuitry 172 drives the B port bit lines, i.e., B_BL and B_BLB, to a logic one and a logic zero, respectively. Data input logic circuitry 172 drives the B port bit lines in response to receiving signals B_in and B_inB from bit line drivers 111 and in response to receiving control signals Cup and Cdown. For example, when data input logic circuitry 172 is implemented as a tri-state buffer as illustrated in FIG. 2B, control signal Cup turns off inverters 176-1, 176-2 and control signal Cdown turns on inverters 180-1, 180-2. With inverters 176-1, 176-2 off and inverters 180-1, 180-2 on, signals B_in and B_inB are twice inverted such that the output of data input logic circuitry 172-1, 172-2 is the same as the input to data input logic circuitry 172-1, 172-2.

In embodiments in which data input logic circuitry 172 is implemented as multiplexer, such as the embodiment illustrated in FIG. 2C, control signals Cup and Cdown turn off transmission gates 196-1, 196-2 and turn on transmission gates 188-1, 188-2. With transmission gates 196-1, 196-2 turned off, input nodes 184-1, 184-2 are respectively decoupled from output nodes 194-1, 194-2. Transmission gates 188-1, 188-2 being turned on, input nodes 184-1, 184-2 are respectively coupled to output nodes 194-1, 194-2. In this manner, the signals B_in and B_inB are respectively output to bit lines B_BL and B_BLB via data input logic circuitry 172-1, 172-2.

In embodiments in which data input logic circuitry 172 is implemented as an XOR gate 202, such as the embodiment illustrated in FIG. 2D, the signal B_in signal is received at an input of XOR gate 202-1 and signal B_inB signal is received at an input of XOR gate 202-2. Control signal Cdown is received at a second input of XOR gates 202-1, 202-2 and XOR gates 202-1, 202-2 respectively output signals to bit lines B_BL and B_BLB in response.

At block 608, the logic one from bit line B_BL and logic zero from bit line B_BLB are stored at latch 128-2. The logic zero and logic one are written to latch 128-2 via the B port, i.e., via bit lines B_BL and B_BLB, by asserting word lines A_WL-1, B_WL-1, and A_WL-1 low and asserting word line B_WL-2 high. Word lines A_WL-1, B_WL-1, and A_WL-1 being low turns off pass transistors for latch 128-1 and the A port for latch 128-2. Word line B_WL-2 being asserted high turns on the pass gates for the B port such that the logic one on bit line B_BL and the logic zero on bit line B_BLB are written to latch 128-2.

The reading of a logic one from the B port of latch 128-2 is described with reference to FIGS. 6B and 7B in which FIG. 6B is a flow diagram of one example of the method 610. At block 612, word lines A_WL-1 and B_WL-1 are asserted low such that pass gate transistors of latch 128-1 are turned off to decouple bit lines A_BL, B_BL, A_BLB, and B_BLB from latch 128-1. Word lines A_WL-2 and B_WL-2 are asserted high such that latch 128-2 is coupled to bit lines A_BL, B_BL, A_BLB, and B_BLB.

At block 614, the signals that develop on bit lines A_BL, B_BL, A_BLB, and B_BLB are sensed by sense amplifiers 206 and 208 as illustrated in FIGS. 3A-3D. Sense amplifier 206, which is coupled to bit lines A_BL and A_BLB, outputs A_DATA signal (i.e., a logic one) based on the sensed differential voltage between A_BL and A_BLB.

At block 616, data output logic circuitry 210 receives the output signal from sense amplifier 208, which receives signals from bit lines B_BL and B_BLB as inputs. In embodiments in which data output logic circuitry 210 is implemented as a tri-state buffer (as shown in FIG. 3B) or multiplexer (as shown in FIG. 3C), an intermediate data signal, B_DATAi, is output from sense amplifier 208 and is received at node 218. In embodiments in which data output logic circuitry 210 is implemented as an XOR gate 202, such as illustrated in FIG. 3D, the intermediate B_DATAi signal output from sense amplifier 208 is received at one of the inputs of XOR gate 202.

At block 618, data output logic circuitry 210 outputs data in response to the intermediate data signal received from sense amplifier 208, i.e., B_DATAi, and control signals Cup and/or Cdown. For example, in embodiments in which output data logic circuitry 210 is implemented as a tri-state buffer as illustrated in FIG. 3B, control signal Cup turns off inverter 212 and control signal Cdown turns on inverter 216 since data is being read from the lower latch 128-2. With inverter 212 off and inverters 214 and 216 on, the intermediate data signal, B_DATAi, is inverted twice and output from node 220.

In embodiments in which output data logic circuitry 210 is implemented as a multiplexer, such as the embodiment illustrated in FIG. 3C, control signals Cup and Cdown turn off transmission gate 230 and turn on transmission gate 224. With transmission gate 230 off, inverter 222 is decoupled from output node 220. Transmission gate 224 being turned on couples input node 218 to output node 220 such that intermediate data signal B_DATAi is output from node 220.

Referring to FIG. 3D, the intermediate data signal B_DATAi output from sense amplifier 208 is received at an input of XOR gate 202. Control signal Cdown, which is a logic one when reading data from the lower latch 128-2, is received at a second input of XOR gate 202. With control signal Cdown and intermediate data signal B_DATAi being logic ones, XOR gate 202 outputs a logic one.

Figures 9A, 9B:
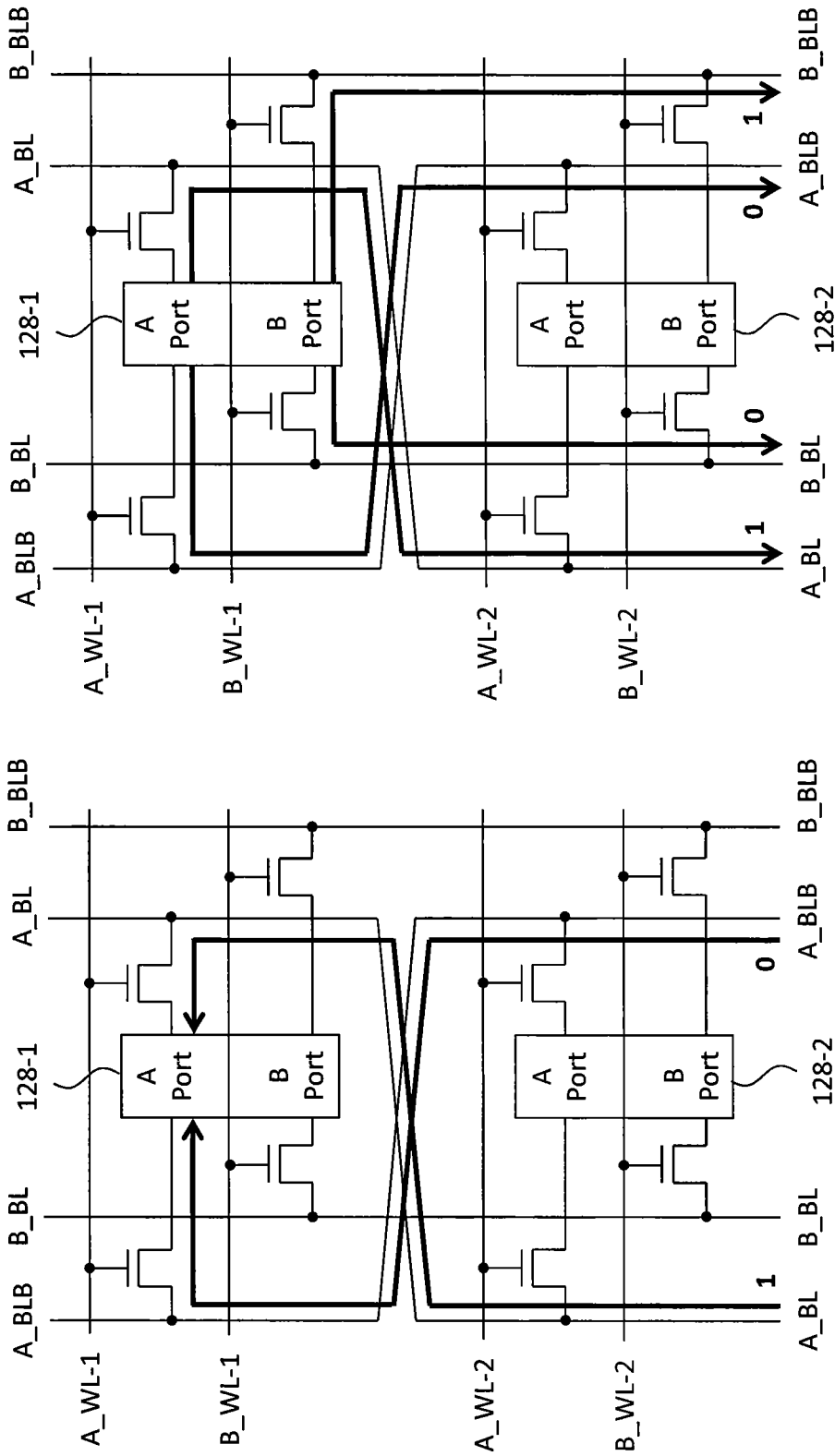
FIGS. 9A and 9B illustrate the data being written to and read from an upper memory bit cell of a pair of adjacent bit cells that are coupled together via twisted bit lines in accordance with the flow diagrams illustrated in FIGS. 8A and 8B, respectively.

The method of writing a logic one to upper latch, e.g., latch 128-1 in FIG. 9A, via the A port is described with reference to FIGS. 8A and 9A in which FIG. 9A is a flow diagram of the method 800. At block 802, bit line drivers 111 output a logic one to bit line A_BL and a logic zero to bit line A_BLB.

At block 804, bit lines B_BL and B_BLB are allowed to float. The floating of bit lines B_BL and B_BLB occurs in response to signals B_in and B_inB, which are output by bit line drivers 111, floating.

At block 806, the logic one is stored at latch 128-1. To write the logic one to latch 128-1 via bit line A_BL, word lines B_WL-1, A_WL-2, and B-WL-2 are asserted low (e.g., logic zeroes) and word line A_WL-1 is asserted high (e.g., a logic one) such that pass gate transistors of latch 128-1 are turned on.

The reading of a logic one from the A port of upper latch 128-1 is described with reference to FIGS. 8B and 9B in which FIG. 8B is a flow diagram of one example of the method 810. At block 812, word lines A_WL-2 and B_WL-2 are asserted low such that pass gate transistors of latch 128-2 are turned off to decouple bit lines A_BL, B_BL, A_BLB, and B_BLB from latch 128-2, and word lines A_WL-1 and B_WL-1 are asserted high such that latch 128-1 is coupled to bit lines A_BL, B_BL, A_BLB, and B_BLB.

At block 814, the signals that develop on bit lines A_BL, B_BL, A_BLB, and B_BLB are sensed by sense amplifiers 206 and 208 as illustrated in FIGS. 3A-3D. Sense amplifier 206, which is coupled to bit lines A_BL and A_BLB, outputs A_DATA signal (i.e., a logic one) based on the sensed differential voltage between A_BL and A_BLB.

At block 816, data output logic circuitry 210 receives the output signal from sense amplifier 208, which receives signals from bit lines B_BL and B_BLB as inputs. In embodiments in which data output logic circuitry 210 is implemented as a tri-state buffer, such as in FIG. 3B, or as a multiplexer, such as FIG. 3C, an intermediate data signal, B_DATAi, is output from sense amplifier 208 and is received at node 218. In embodiments in which data output logic circuitry 210 is implemented as an XOR gate 202 (FIG. 3D), the intermediate B_DATAi signal output from sense amplifier 208 is received at one of the inputs of XOR gate 202.

At block 418, data output logic circuitry 210 outputs data in response to the intermediate data signal received from sense amplifier 208, i.e., B_DATAi, and control signals Cup and/or Cdown. In embodiments in which output data logic circuitry 210 is implemented as a tri-state buffer, i.e., as illustrated in FIG. 3B, control signal Cup turns on inverter 212 and control signal Cdown turns off inverter 216 since data is being read from upper latch 128-1. With inverter 212 on and inverter and 216 off, the intermediate data signal, B_DATAi, is inverted and output from node 220 such that the output of data output logic circuitry 210 is opposite that which is received at the input of data output logic circuitry.

In embodiments in which output data logic circuitry 210 is implemented as a multiplexer, as illustrated in FIG. 3C, control signals Cup and Cdown turn off transmission gate 224 and turn on transmission gate 230. Transmission gate 224 being turned off decouples input node 218 to output node 220. With transmission gate 230 on, inverter 222 is coupled to output node 220 such that intermediate data signal B_DATAi is inverted and output to node 220.

Referring now to FIG. 3D, the intermediate data signal B_DATAi output from sense amplifier 208 is received at an input of XOR gate 202. Control signal Cdown, which is a logic zero when reading data from the upper latch 128-1, is received at a second input of XOR gate 202. With control signal Cdown a logic zero and intermediate data signal B_DATAi being a logic one, XOR gate 202 outputs a logic zero.

Figures 10A, 10B:
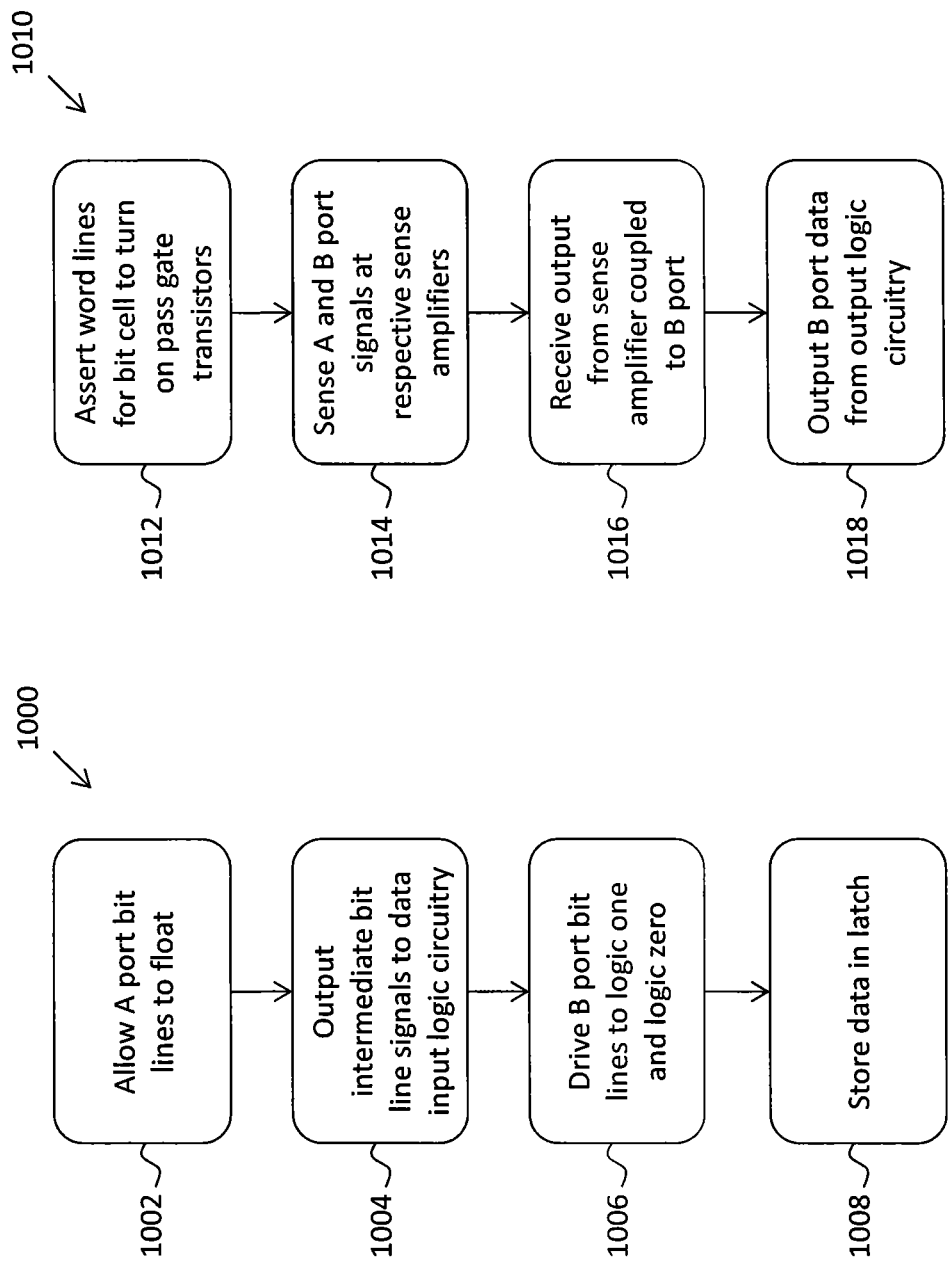
FIGS. 10A and 10B are flow diagrams of methods of writing and reading data from a second port of a memory bit cell in accordance with some embodiments, respectively.
Figures 11A, 11B:
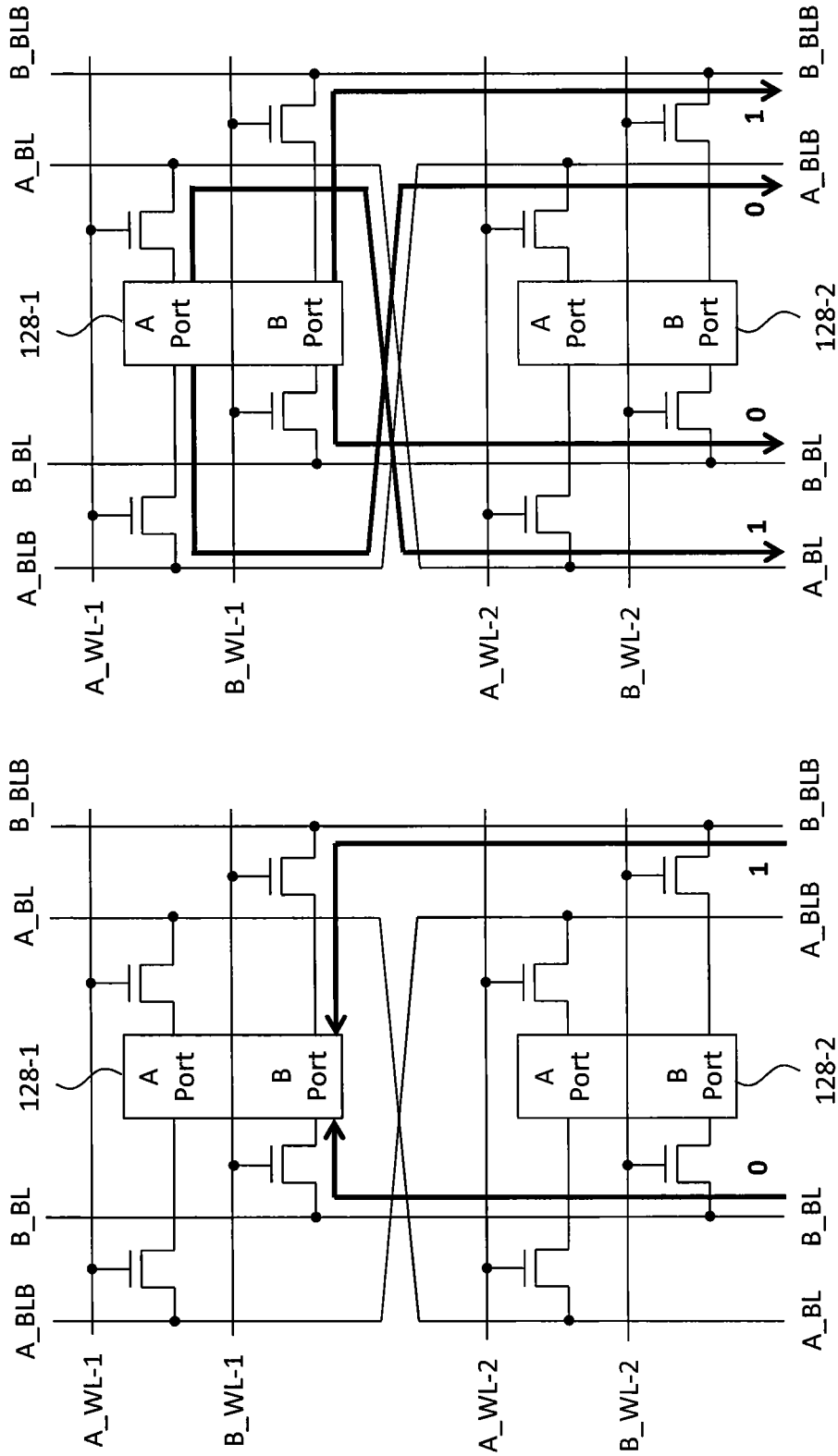
FIGS. 11A and 11B illustrate the data being written to and read from an upper bit cell of a pair of adjacent bit cells that are coupled together via twisted bit lines in accordance with the flow diagrams illustrated in FIGS. 10A and 10B, respectively.

The method of writing a logic zero to an upper latch, e.g., latch 128-1 in FIG. 11A, via the B port is described with reference to FIGS. 10A and 11A in which FIG. 10A is a flow diagram of the method 1000. At block 1002, A port bit lines, i.e., A_BL and A_BLB, are allowed to float by bit line drivers 111.

At block 1004, bit line drivers 111 for the B port output a logic one as signal B_in and a logic zero as signal B_inB to data input logic circuitry 172. In embodiments in which data input logic circuitry 172 is implemented as a tri-state buffer, i.e., as illustrated in FIG. 2B, signal B_in is received at node 174-1 data input logic circuitry 172-1 and signal B_inB is received at node 172-2 of data input logic circuitry 172-2. When data input logic circuitry 172 is implemented as a multiplexer as illustrated in FIG. 2C, signal B_in is received at node 184-1 and signal B_inB is received at node 184-2. In embodiments in which data input logic circuitry 172 is implemented as an XOR gate 202, the signal B_in signal is received at an input of XOR gate 202-1 and signal B_inB signal is received at an input of XOR gate 202-2.

At block 1006, data input logic circuitry 172 drives the B port bit lines, i.e., B_BL and B_BLB, to a logic zero and a logic one, respectively. Data input logic circuitry 172 drives the B port bit lines in response to receiving signals B_in and B_inB from bit line drivers 111 and in response to receiving control signals Cup and Cdown. For example, when data input logic circuitry 172 is implemented as a tri-state buffer as illustrated in FIG. 2B, control signal Cup turns on inverters 176-1, 176-2 and control signal Cdown turns off inverters 180-1, 180-2. With inverters 176-1, 176-2 on and inverters 180-1, 180-2 off, signals B_in and B_inB are inverted once such that the output of data input logic circuitry 172-1, 172-2 is the opposite as the input to data input logic circuitry 172-1, 172-2.

In embodiments in which data input logic circuitry 172 is implemented as multiplexer, such as the embodiment illustrated in FIG. 2C, control signals Cup and Cdown turn on transmission gates 196-1, 196-2 and turn off transmission gates 188-1, 188-2. With transmission gates 196-1, 196-2 turned on, input nodes 184-1, 184-2 are respectively coupled to output nodes 194-1, 194-2 through inverters 186-1, 186-2. Transmission gates 188-1, 188-2 being turned off, input nodes 184-1, 184-2 are respectively decoupled from output nodes 194-1, 194-2. In this manner, the signals B_in and B_inB are inverted and respectively output to bit lines B_BL and B BLB via data input logic circuitry 172-1, 172-2.

In embodiments in which data input logic circuitry 172 is implemented as an XOR gate 202, such as the embodiment illustrated in FIG. 2D, the signal B_in signal is received at an input of XOR gate 202-1 and signal B_inB signal is received at an input of XOR gate 202-2. Control signal Cdown is received at a second input of XOR gates 202-1, 202-2 and XOR gates 202-1, 202-2 respectively output signals to bit lines B_BL and B_BLB in response.

At block 1008, the logic zero from bit line B_BL and logic one from bit line B_BLB are stored at latch 128-1. The logic zero and logic one are written to upper latch 128-1 via the B port, i.e., via bit lines B_BL and B_BLB, by asserting word lines A_WL-1, A_WL-2, and B_WL-2 low and asserting word line B_WL-1 high. Word lines A_WL-1, A_WL-2, and B_WL-2 being low turns off the pass transistors for latch 128-2 and the A port for latch 128-1. Word line B_WL-1 being asserted high turns on the pass gates for the B port of latch 128-1 such that the logic zero on bit line B_BL and the logic one on bit line B_BLB are written to latch 128-1.

The reading of a logic zero from the B port of upper latch 128-1 is described with reference to FIGS. 10B and 11B in which FIG. 10B is a flow diagram of one example of the method 1010. At block 1012, word lines A_WL-1 and B_WL-1 are asserted high such that pass gate transistors of latch 128-1 are turned on to couple bit lines A_BL, B_BL, A_BLB, and B BLB to latch 128-1. Word lines A WL-2 and B_WL-2 are asserted low such that latch 128-2 is decoupled from bit lines A_BL, B_BL, A_BLB, and B_BLB.

At block 1014, the signals that develop on bit lines A_BL, B_BL, A_BLB, and B_BLB are sensed by sense amplifiers 206 and 208 as illustrated in FIGS. 3A-3D. Sense amplifier 206, which is coupled to bit lines A_BL and A_BLB, outputs A_DATA signal (i.e., a logic one) based on the sensed differential voltage between A_BL and A_BLB.

At block 1016, data output logic circuitry 210 receives the output signal from sense amplifier 208, which receives signals from bit lines B_BL and B_BLB as inputs. In embodiments in which data output logic circuitry 210 is implemented as a tri-state buffer (as shown in FIG. 3B) or multiplexer (as shown in FIG. 3C), an intermediate data signal, B_DATAi, is output from sense amplifier 208 and is received at node 218. In embodiments in which data output logic circuitry 210 is implemented as an XOR gate 202, such as illustrated in FIG. 3D, the intermediate B_DATAi signal output from sense amplifier 208 is received at one of the inputs of XOR gate 202.

At block 1018, data output logic circuitry 210 outputs data in response to the intermediate data signal received from sense amplifier 208, i.e., B_DATAi, and control signals Cup and/or Cdown. For example, in embodiments in which output data logic circuitry 210 is implemented as a tri-state buffer as illustrated in FIG. 3B, control signal Cup turns on inverter 212 and control signal Cdown turns off inverter 216 since data is being read from the upper latch 128-1. With inverter 212 on and inverters 214 and 216 off, the intermediate data signal, B_DATAi, is inverted once and output from node 220 such that the output of data output logic circuitry 210 is a logic one.

In embodiments in which output data logic circuitry 210 is implemented as a multiplexer, such as the embodiment illustrated in FIG. 3C, control signals Cup and Cdown turn on transmission gate 230 and turn off transmission gate 224. With transmission gate 230 on and transmission gate 224 off, input node 218 is coupled to output node 220 via inverter 222 such that intermediate data signal B_DATAi is inverted prior to being output to output node 220.

Referring to FIG. 3D, the intermediate data signal B_DATAi output from sense amplifier 208 is received at an input of XOR gate 202. Control signal Cdown, which is a logic zero when reading data from the upper latch 128-1, is received at a second input of XOR gate 202. With control signal Cdown and intermediate data signal B_DATAi being logic zeroes, XOR gate 202 outputs a logic one.

The semiconductor memory array and their associated methods of operation disclosed above advantageously prevent data inversion for twisted memory bit cells. Additionally, the added circuitry is inexpensive and simple to implement while providing enhanced data write and read accuracy.

In some embodiments, a semiconductor memory includes first and second memory storage latches each including first and second ports. A first pair of bit lines is coupled to the first ports of the first and second memory storage latches. A second pair of bit lines is coupled to the second ports of the first and second memory storage latches. The first and second pairs of bit lines are twisted between the first and second memory storage latches. A first sense amplifier is coupled to the first pair of bit lines for outputting data based on a voltage difference between the first pair of bit lines, and a second sense amplifier is coupled to the second pair of bit lines for outputting an intermediate data signal based on a voltage difference between the second pair of bit lines. Output logic circuitry is coupled to an output of the second sense amplifier. The output logic circuitry is configured to output data based on the intermediate data signal and a control signal that identifies if the data is being read from the first memory storage latch or from the second memory storage latch.

In some embodiments, a semiconductor memory includes first and second memory storage latches each including first and second ports. A first pair of bit lines is coupled to the first ports of the first and second memory storage latches, and a second pair of bit lines is coupled to the second ports of the first and second memory storage latches. The first and second pairs of bit lines are twisted between the first and second memory storage latches. A first pair of bit line drivers is coupled to the first pair of bit lines, and a second pair of bit line drivers for providing intermediate voltages. Input logic circuitry is coupled to outputs of the second pair of bit line drivers and is configured to adjust a voltage of the second pair of bit line drivers in response to the intermediate voltages output from the second pair of bit line drivers and a control signal that identifies if the data is being written to the first memory storage latch or to the second memory storage latch.

In some embodiments, a method includes decoupling a first memory storage latch from a first pair of bit lines and from a second pair of bit lines, and coupling a second memory storage to the first and second pairs of bit lines. The first and second pairs of bit lines are twisted between the first and second memory storage latches. Data is output from a first sense amplifier coupled to the first pair of bit lines based on a voltage difference between the first pair of bit lines, and an intermediate data signal is output from a second sense amplifier coupled to the second pair of bit lines based on a voltage difference between the second pair of bit lines. Data from output logic circuitry is output based on the intermediate data signal and a control signal that identifies if the data is being read from the first memory storage latch or from the second memory storage latch.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
   first and second memory storage latches each including first and second ports;
   a first pair of bit lines coupled to the first ports of the first and second memory storage latches;
   a second pair of bit lines coupled to the second ports of the first and second memory storage latches, the first and second pairs of bit lines being twisted between the first and second memory storage latches;
   a first sense amplifier coupled to the first pair of bit lines for outputting data based on a voltage difference between the first pair of bit lines;
   a second sense amplifier coupled to the second pair of bit lines for outputting an intermediate data signal based on a voltage difference between the second pair of bit lines; and
   output logic circuitry coupled to an output of the second sense amplifier, the output logic circuitry configured to output data based on the intermediate data signal and a control signal that identifies if the data is being read from the first memory storage latch or from the second memory storage latch.

2. The semiconductor memory of claim 1, wherein the output logic circuitry includes a tri-state buffer.

3. The semiconductor memory of claim 1, wherein the output logic circuitry includes a multiplexer.

4. The semiconductor memory of claim 1, wherein the output logic circuitry includes an XOR gate.

5. The semiconductor memory of claim 1, further comprising:
   a first pair of bit line drivers coupled to the first pair of bit lines;
   a second pair of bit line drivers for providing intermediate voltages; and
   input logic circuitry coupled to outputs of the second pair of bit line drivers, the input logic circuitry configured to adjust a voltage of the second pair of bit line drivers in response to the intermediate voltages output from the second pair of bit line drivers and a control signal that identifies if the data is being written to the first memory storage latch or to the second memory storage latch.

6. The semiconductor memory of claim 5, wherein the input logic circuitry includes a tri-state buffer.

7. The semiconductor memory of claim 5, wherein the input logic circuitry includes a multiplexer.

8. The semiconductor memory of claim 5, wherein the input logic circuitry includes an XOR gate.

9. A semiconductor memory, comprising:
   first and second memory storage latches each including first and second ports;
   a first pair of bit lines coupled to the first ports of the first and second memory storage latches;
   a second pair of bit lines coupled to the second ports of the first and second memory storage latches, the first and second pairs of bit lines being twisted between the first and second memory storage latches;
   a first pair of bit line drivers coupled to the first pair of bit lines;
   a second pair of bit line drivers for providing intermediate voltages; and
   input logic circuitry coupled to outputs of the second pair of bit line drivers, the input logic circuitry configured to adjust a voltage of the second pair of bit line drivers in response to the intermediate voltages output from the second pair of bit line drivers and a control signal that identifies if the data is being written to the first memory storage latch or to the second memory storage latch.

10. The semiconductor memory of claim 9, wherein the input logic circuitry includes a tri-state buffer.

11. The semiconductor memory of claim 9, wherein the input logic circuitry includes a multiplexer.

12. The semiconductor memory of claim 9, wherein the input logic circuitry includes an XOR gate.

13. The semiconductor memory of claim 9, further comprising:
   a first sense amplifier coupled to the first pair of bit lines for outputting data based on a voltage difference between the first pair of bit lines;
   a second sense amplifier coupled to the second pair of bit lines for outputting an intermediate data signal based on a voltage difference between the second pair of bit lines; and
   output logic circuitry coupled to an output of the second sense amplifier, the output logic circuitry configured to output data based on the intermediate data signal and a control signal that identifies if the data is being read from the first memory storage latch or from the second memory storage latch.

14. The semiconductor memory of claim 13, wherein the output logic circuitry includes a tri-state buffer.

15. The semiconductor memory of claim 13, wherein the output logic circuitry includes a multiplexer.

16. The semiconductor memory of claim 13, wherein the output logic circuitry includes an XOR gate.

17. A method, comprising:
   decoupling a first memory storage latch from a first pair of bit lines and from a second pair of bit lines;

coupling a second memory storage to the first and second pairs of bit lines, the first and second pairs of bit lines being twisted between the first and second memory storage latches;

outputting data from a first sense amplifier coupled to the first pair of bit lines based on a voltage difference between the first pair of bit lines;

outputting an intermediate data signal from a second sense amplifier coupled to the second pair of bit lines based on a voltage difference between the second pair of bit lines; and outputting data from output logic circuitry based on the intermediate data signal and a control signal that identifies if the data is being read from the first memory storage latch or from the second memory storage latch.

18. The method of claim 17, wherein the output logic circuitry includes a tri-state buffer.

19. The method of claim 17, wherein the output logic circuitry includes a multiplexer.

20. The method of claim 17, wherein the output logic circuitry includes an XOR gate.

* * * * *